United States Patent
He et al.

(10) Patent No.: US 7,907,416 B2
(45) Date of Patent: Mar. 15, 2011

(54) POWER SUPPLY SYSTEM, POWER CABLE DISTRIBUTOR, POWER SUPPLY SUBRACK AND INTEGRATED EQUIPMENT

(75) Inventors: Ying He, Hangzhou (CN); Ping Yang, Hangzhou (CN); Zhiyong Wang, Hangzhou (CN); Wenxiang Zhou, Hangzhou (CN); Baohong Li, Hangzhou (CN)

(73) Assignee: Hangzhou H3C Technologies Co., Ltd., Hangzhou (CN)

( * ) Notice: Subject to any disclaimer, the term of this patent is extended or adjusted under 35 U.S.C. 154(b) by 93 days.

(21) Appl. No.: 12/323,103

(22) Filed: Nov. 25, 2008

(65) Prior Publication Data

US 2009/0072621 A1   Mar. 19, 2009

Related U.S. Application Data

(63) Continuation of application No. PCT/CN2007/070197, filed on Jun. 28, 2007.

(30) Foreign Application Priority Data

Dec. 4, 2006   (CN) .......................... 2006 1 0161040

(51) Int. Cl.
H05K 5/00   (2006.01)
(52) U.S. Cl. .......................... 361/756; 361/748; 361/788
(58) Field of Classification Search .................. 361/788, 361/760, 735, 748, 756, 686, 737
See application file for complete search history.

(56) References Cited

U.S. PATENT DOCUMENTS

| | | | | |
|---|---|---|---|---|
| 4,507,720 A * | 3/1985 | Colbrese | .......................... | 363/13 |
| 5,812,392 A * | 9/1998 | Dutto et al. | .................... | 700/22 |
| 6,081,419 A * | 6/2000 | Pham | .......................... | 361/617 |
| 6,433,609 B1 * | 8/2002 | Voldman | ...................... | 327/313 |
| 6,737,582 B2 * | 5/2004 | Van Lieu et al. | ................ | 174/53 |
| 6,912,123 B2 * | 6/2005 | Sakai et al. | ............. | 361/679.47 |
| 6,914,166 B2 * | 7/2005 | Dakka et al. | .................. | 585/533 |
| 7,382,624 B2 * | 6/2008 | Barsun et al. | ................. | 361/730 |
| 7,393,248 B2 * | 7/2008 | Best et al. | ..................... | 439/638 |
| 7,585,034 B2 * | 9/2009 | Cabrera et al. | ............... | 312/350 |
| 2002/0101725 A1 | 8/2002 | Kaetsu et al. | ................ | 361/797 |
| 2002/0145858 A1 | 10/2002 | Hayashi et al. | .............. | 361/798 |
| 2007/0067654 A1 * | 3/2007 | Adachi | ....................... | 713/300 |

FOREIGN PATENT DOCUMENTS

| | | |
|---|---|---|
| CN | 1946167 | 4/2007 |
| JP | 2002-232167 | 8/2002 |
| JP | 2002-305389 | 10/2002 |
| WO | WO 2006/104431 | 10/2006 |

OTHER PUBLICATIONS

International Search Report for Application No. PCT/CN2007/070197, dated Sep. 27, 2007.

* cited by examiner

*Primary Examiner* — Hung S Bui
(74) *Attorney, Agent, or Firm* — Marshall, Gerstein & Borun LLP

(57) ABSTRACT

A power supply system is provided, which includes a power supply subrack (PSS) and a power cable distributor (PCD). The PSS includes one or more power modules and a third connector (51), and the PCD is adapted to introduce one or more electrical signals from power input cables. The third connector (51) in the PSS is connected to the PCD and adapted to feed the introduced electrical signals to the power modules. Furthermore, a power cable distributor, a power supply subrack adapted to work with the PCD and an integrated equipment are provided.

21 Claims, 8 Drawing Sheets power modules

POWER SUPPLY SYSTEM, POWER CABLE DISTRIBUTOR, POWER SUPPLY SUBRACK AND INTEGRATED EQUIPMENT

CROSS-REFERENCE TO RELATED APPLICATIONS

This is a continuation of International Application PCT/CN2007/070197 filed Jun. 28, 2007, which in turn claims the priority of Chinese Application No. 200610161040.X filed Dec. 4, 2006, the entire respective disclosures of which are incorporated herein by reference.

FIELD OF THE INVENTION

The present invention relates to technologies of power supply for equipment, and particularly, to a power supply system, a power cable distributor, a power supply subrack and an integrated equipment.

BACKGROUND OF THE INVENTION

In the communication industry, the following two modes, one is alternating current input 220 Vac (110 Vac) and the other is direct current input −48 Vdc (−60 Vdc), are usually adopted as power supply for high power equipments. Normally, an integrated equipment requires the width of an embedded power supply subrack (PSS) to be 19 inches or 23 inches so that the PSS can be embedded conveniently into a standard integrated equipment cabinet of 19 or 23 inches wide, and the height of the PSS should be multiple of U (1 U approximately equals to 44.45 mm). The PSS includes at least one power module. Since the input current is usually very high in the high power system, a high power PSS providing alternating or direct current usually adopts multiple parallel power modules and power input cables are directly connected to the power modules, to meet the power supply demand of the integrated equipment.

Two input-output schemes can be adopted for the power modules: front input rear output scheme and rear input rear output scheme. When the front input rear output scheme is adopted, either of the following two connection patterns may be used: according to the first connection pattern, power input cables are connected directly to input terminals of the power modules; according to the second connection pattern, the input terminals at the front end of the power modules are extended to the rear end of the power modules via cables and the power input cables are connected to the input terminals at the rear end. When the rear input rear output scheme is adopted, the power input cables are connected directly to the input terminals at the rear end of the power modules.

For the sake of keeping a neat arrangement at the front end of the equipment, the rear input rear output scheme is usually adopted, or the input terminals at the front end are extended to the rear end of the integrated equipment via cables so as to be connected to the power input cables. FIG. 1 is a schematic illustrating the power input cables connected to the integrated equipment at the rear end in the conventional art. The PSS shown in the figure includes four power modules, each of which is connected to two power input cables. In additional, each of the power modules is connected to a ground wire, or the four power modules share a ground wire. In this way, the PSS is connected to 9 wires at least and even 12 wires. As a result, it can be seen from the back of the PSS that many wires gather at the rear end of the integrated equipment.

Those skilled in the art should know that no universal standard can be set up to define the dimensions of integrated equipments since the integrated equipments vary greatly concerning structure complexity. At present, a universal standard width is adopted by integrated equipments, yet the depths of integrated equipments still vary greatly.

FIG. 2 is the side view of an integrated equipment in the conventional art. It can be seen in the figure that a main machine and a PSS are embedded into the cuboid integrated equipment, the depth of the PSS is essentially identical with that of the integrated equipment and a number of power input cables are connected to the rear end of the PSS. The depth of the integrated equipment is mainly determined by the dimension of the main machine, and the PSS is embedded into the integrated equipment under the main machine. As explained above, the depths of different main machines may vary greatly because of different structure complexity of the main machines and the depths of matched integrated equipments in turn vary greatly. Therefore, the depth of an integrated equipment may be much greater than that of the embedded PSS, and the surface of the rear end of the PSS may be far away from the surface of the rear end of the integrated equipment, as shown in FIG. 3. As a number of power input cables are to be connected to the rear end of the PSS, it will be difficult for operators to connect the power input cables since the power input sockets of the PSS are far away from the surface of the rear end of the integrated equipment and the PSS is usually of low height.

In order to avoid the difficulties of connection operation mentioned above, manufacturers need to produce PSSs of different dimensions for integrated equipments of different dimensions so that each integrated equipment may find the best match as shown in FIG. 2. However, such practice is unsuitable for mass production and the cost of such PSS reproduction is high. It is obvious that the application range of PSS with fixed dimensions in the conventional art is small and usually such PSS is merely suitable to be embedded into an equipment of certain fixed depth.

SUMMARY

Embodiments of the present invention provide a power supply system for equipment, which enables a PSS of fixed dimensions to fit into integrated equipments of different depths so that operators can connect input cables easily and the application range of the PSS of fixed dimensions can be broadened.

The following technical solutions are provided in the embodiments of the present invention.

A power supply system, including a power supply subrack (PSS) and a power cable distributor (PCD), wherein the PSS further includes one or more power modules and a third connector, and the PCD is adapted to introduce one or more electrical signals from power input cables;

the third connector in the PSS is connected to the PCD and adapted to feed the introduced electrical signals to the one or more power modules.

An integrated equipment, including a main machine and a power supply system mentioned above, wherein the electrical signals output by the power modules of the PSS in the power supply system are transmitted to the main machine.

A power cable distributor (PCD), including a first connector, a second connector and a first transmission unit, wherein the first connector is adapted to introduce one or more electrical signals from power input cables;

the first transmission unit is adapted to transmit the one or more electrical signals introduced by the first connector to the second connector; and the second connector is adapted to transmit the one or more electrical signals from the transmission unit to a power supply subrack (PSS).

A power supply subrack (PSS) adapted to work with the PCD, including one or more power modules, a third connector and a second transmission unit, wherein the third connector is adaptive to the second connector of the PCD and is adapted to introduce the electrical signals from the PCD to the second transmission unit; and the second transmission unit is adapted to transmit the introduced electrical signals to corresponding power modules.

It can be seen from the technical scheme above that the power supply system of the present invention includes a PSS and a PCD connected to the PSS, wherein the PCD introduces electrical signals from power input cables via the first connector and transmits the electrical signals to the second connector which in turn output the electrical signals to the power module(s) of the PSS. It can be seen from the internal structure of the PCD that the present invention is easy to implement and requires low cost. PCDs of various dimensions can easily be manufactured to match the PSS of fixed dimensions in practical applications. Furthermore, when the depth of the PSS differs greatly from that of the integrated equipment, the expensive PSS need not be replaced, a PCD of appropriate depth (dimensions) can be connected to the PSS to make the total depth of the PSS plus the PCD match the depth of the integrated equipment, hence it will not be difficult to connect the power input cables. By adopting low-cost PCDs, the technical scheme of the present invention broadens the application range of the expensive, fixed-dimensioned PSS and enables the PSS to match integrated equipments of different depths.

Furthermore, compared with the conventional art in which every power module needs an individual group of power input cables, the present invention requires much less power input cables since every group of the electrical signals introduced from the power input cables via the PCD can be fed to a plurality of power modules in the PSS. This is of special significance to high power equipment since the technical scheme of the present invention keeps cables in order on the surface of the equipment so that the equipment will not need any excessive space.

In addition, the PCD may also include switches to turn on/off the electrical signals introduced via the PCD and an electrical signal may be fed to a number of power modules, therefore a switch can control the power supply of a number of power modules and an operator can easily turn off all switches to power off all power modules, hence the problem of overload and system malfunction, which are caused by powering off power modules asynchronously, can be prevented to a certain extent.

Moreover, the power supply system of the present invention can be adapted to different environments by simply transforming voltages in the PCD. For example, the power modules of many high power PSSs in the conventional art are unable to provide consistent power output when the public power supply is 220 Vac in some areas and 110 Vac in others, new PSSs with more power modules have to replace the original ones in order to provide integrated equipments with required power in the existing power supply system. Such practice requires considerable cost. According to the technical scheme of the present invention, the voltage of the power input can be transformed simply in the low-cost PCD, e.g., from 110 Vac to 190 Vac, before the power is fed to the PSS, hence the power output by the PSS power modules to the integrated equipment will basically meet the requirements of the integrated equipment without replacing the original PSS.

EMBODIMENTS OF THE INVENTION

The technical scheme disclosed by the present invention has greater effect on high power equipments. However, those skilled in the art should aware that the technical scheme of the present invention is also applicable to low power equipments.

According to the conventional art, the supply voltage of equipments is either alternating current (AC) voltage or direct current (DC) voltage. Therefore, the following description will describe a preferred embodiment of AC power supply system in accordance with the present invention and a preferred embodiment of direct current power supply system in accordance with the present invention. The two types of power supply systems are practically consistent concerning the system structure, hence the physical structure of the preferred embodiments of the present invention is explained first hereinafter, then the electrical structure of the power supply system provided by the present invention is explained with reference to two power cable distributors (PCD), and after that a schematic of the logic structure of the power supply system provided by the present invention will be explained.

Figure 1:
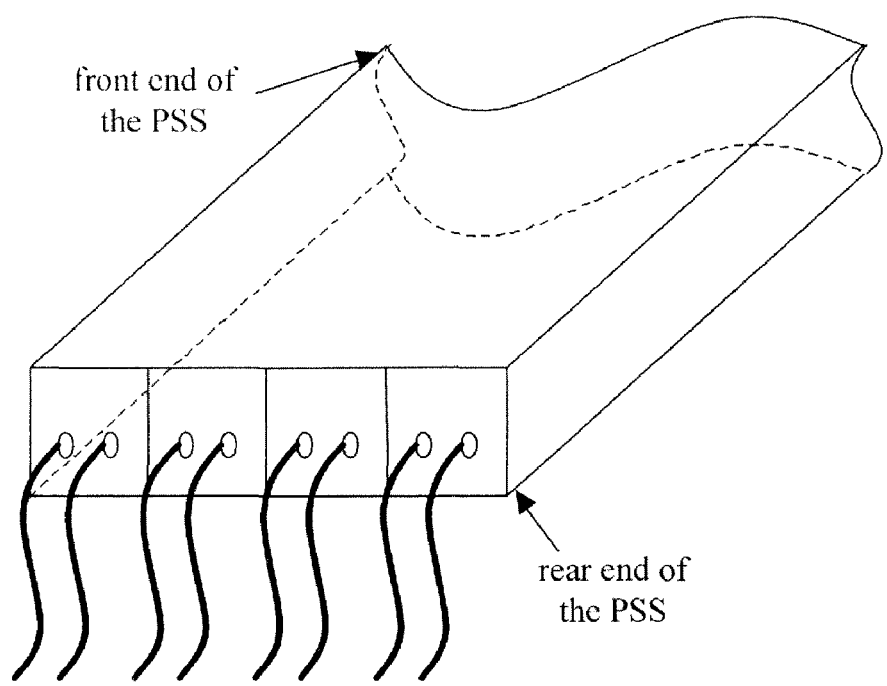
FIG. 1 is a schematic illustrating power input cables connected to an integrated equipment at the rear end in the conventional art.
Figure 2:
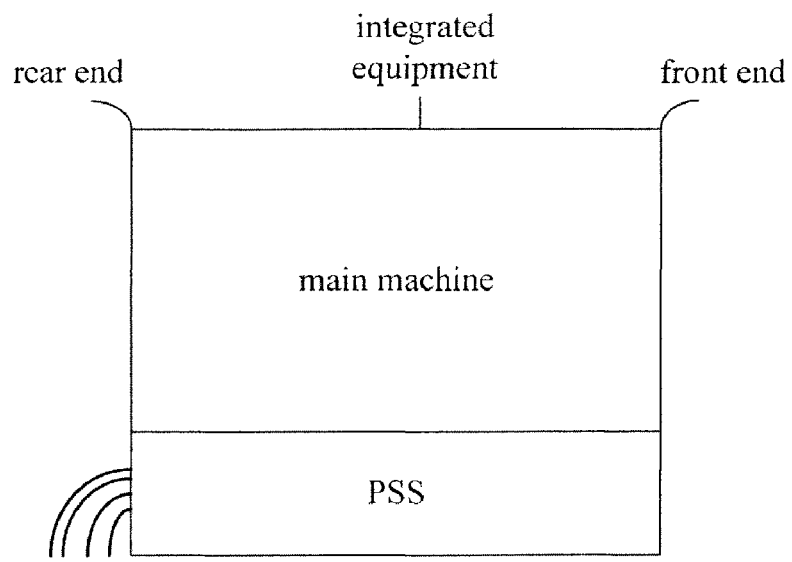
FIG. 2 is the side view of an integrated equipment in the conventional art.
Figure 3:
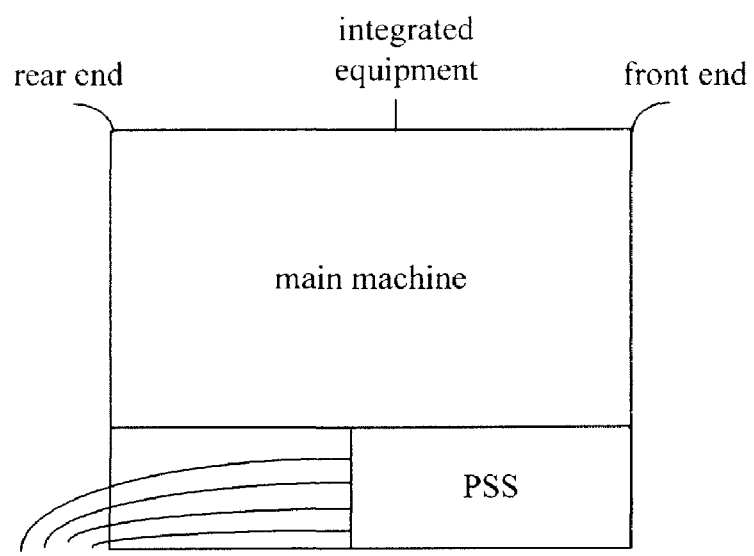
FIG. 3 is the side view of an integrated equipment in the conventional art in which the depth of the PSS differs greatly with the depth of the integrated equipment.
Figure 4:
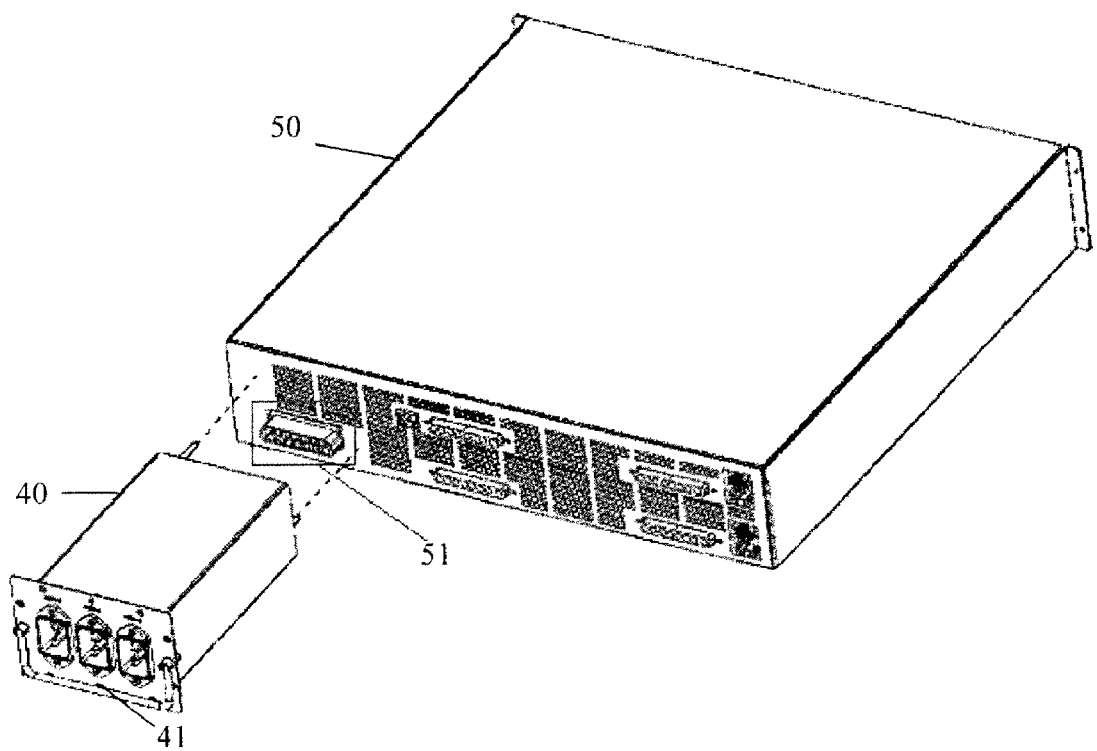
FIG. 4 is a schematic of the physical structure of the power supply system in the first embodiment of the present invention.

FIG. 4 is a schematic of the physical structure of the power supply system in the first embodiment of the present invention. As shown in FIG. 4, the AC power supply system in accordance with the embodiment includes PSS 50 and PCD 40 connected to the PSS 50.

Concerning the external structure of the PCD 40, the PCD 40 includes a socket-type first connector 41, and also includes at the rear end a second connector (not shown in the drawing). The PSS 50 includes a third connector 51, and the second connector is adaptive to the third connector 51. In practical applications, the second connector at the rear end of the PCD 40 is socket jointed to the third connector 51 to physically and electrically connect the PCD 40 and the PSS 50. It should be noted that the coupling means between the second connector and the third connector 51, which electrically connect the PCD 40 and the PSS 50, is not limited to socket joint and clamping connection, it may also be other types of coupling means such as cable connection. When the PCD 40 and the PSS 50 are connected via cables, the first connector 41 and the third connector 51 may be a pair or pairs of matched cable terminals, which can be seen externally, and each of the pairs are connected via a cable; or, the first connector 41 may include both cable(s) and cable terminal(s) while the third connector 51 only includes matched cable terminal(s); or, vice versa. To sum up, any type of coupling means between the PCD 40 and the PSS 50 is acceptable as long as the PCD 40 and the PSS 50 can be disconnected and electrically connected.

Figure 5:
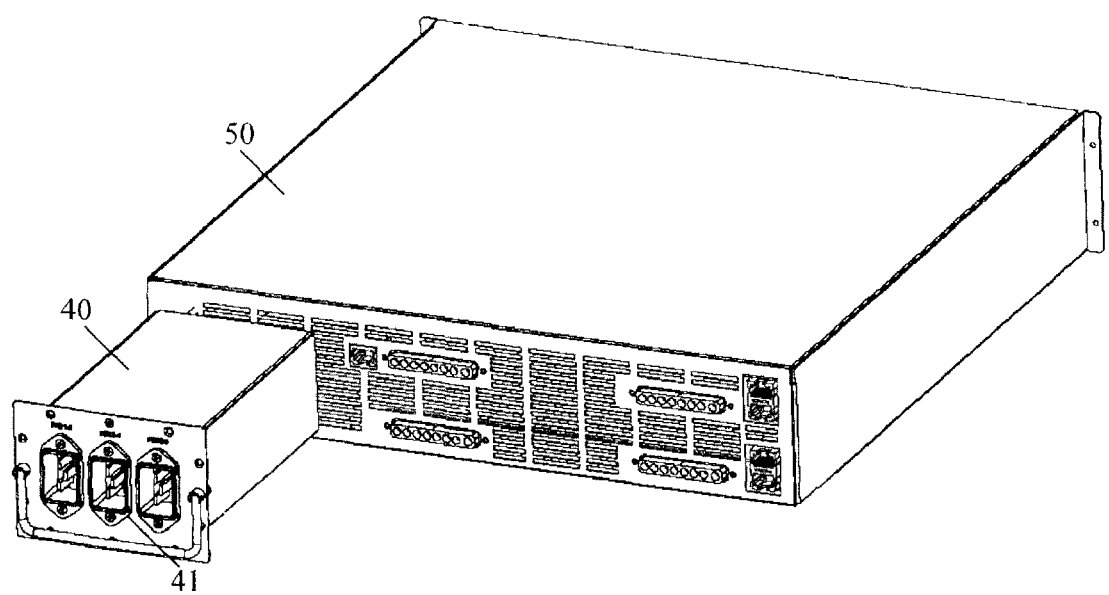
FIG. 5 is a 3-dimentional schematic of the power supply system in FIG. 4 in which the PCD and the PSS are connected.
Figure 6:
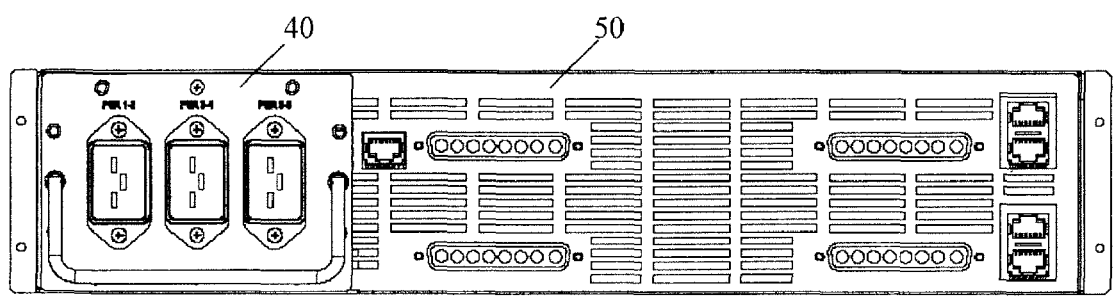
FIG. 6 is the front view of the power supply system in FIG. 4 in which the PCD and the PSS are connected.
Figure 7:
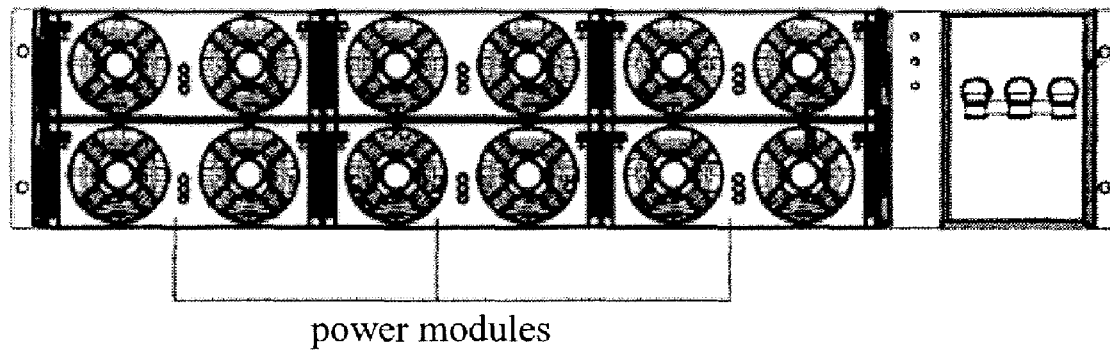
FIG. 7 is the front view of a PSS.

The 3-dimentional view and the front view of the connected PCD 40 and PSS 50 are shown in FIG. 5 and FIG. 6 respectively. All electrical signals transmitted over the power input cables (including live wire electrical signals, zero wire electrical signals and ground wire electrical signals) are introduced into the PCD 40 via the first connector 41 and further transmitted to the second connector of the PCD 40 via a first transmission unit within the PCD 40. Since the second connector of the PCD 40 is electrically connected to the third connector 51 of the PSS 50, the electrical signals introduced by the PCD 40 from the power input cables are exported to the PSS 50. The front view of the PSS in FIG. 7 shows the physical structure of the PSS 50. Normally, the PSS 50 includes a plurality of parallel connected power modules, each of which can supply power for equipment. The power module and the method of power supply for equipment provided by the power module are identical with those in the conventional art and will not be explained herein. In fact, the PSS 50 also includes a second transmission unit which transmits the electrical signals from the third connector 51 to corresponding power module(s). The first transmission unit in the PCD 40 and the second transmission unit in the PSS 50 will be further explained with reference to the schematics illustrating the electrical structure of the power supply system of the present invention.

Figure 8:
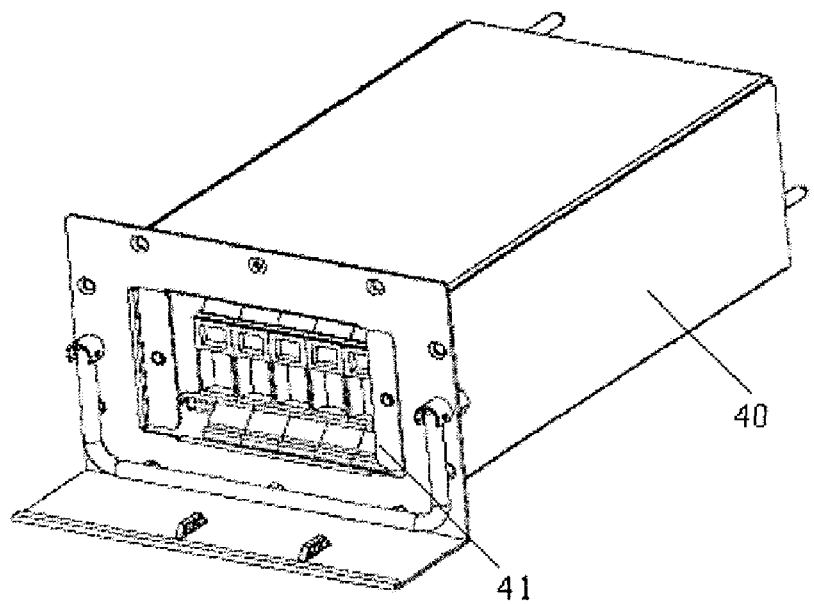
FIG. 8 is a schematic illustrating the external structure of a PCD using AC Y-type connection.
Figure 9:
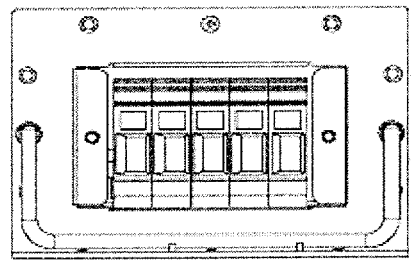
FIG. 9 is a schematic illustrating the external structure of a PCD using AC Delta-type connection.

The PCD 40 described above is an AC socket-type PCD. However, varieties of PCD can be adopted to match different power input cables in real practice. FIG. 8 shows the external structure of a PCD adopting an AC Y-type (star-shaped) connection and FIG. 9 shows the external structure of a PCD adopting an AC Delta-type (triangular-shaped) connection in accordance with embodiments of the present invention. The main differences between the AC Y-type PCD, the AC Delta-type PCD and the AC socket-type PCD consist in the structure of the first connector 41 and the implementation of the internal transmission unit and will be explained with reference to the schematics illustrating the electrical structure of the power supply system of the present invention.

Figure 10:
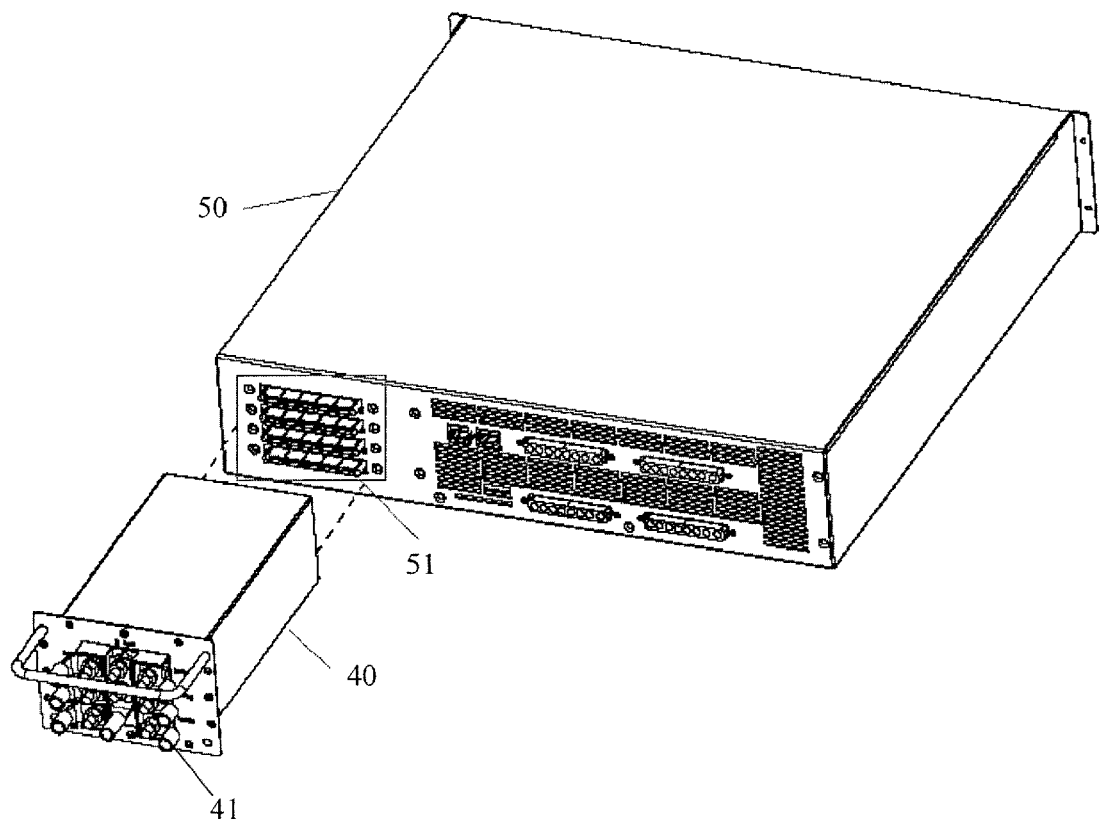
FIG. 10 is a schematic of the physical structure of the power supply system in the second embodiment of the present invention.

FIG. 10 is a schematic of the physical structure of the power supply system in the second embodiment of the present invention. The PCD 40 in this embodiment is an AC PCD. The external structure of the PCD 40 shown in FIG. 10 indicates that the PCD 40 includes the first connector 41, the PSS 50 includes the third connector 51, and the PCD 40 also includes at the rear end a second connector (not shown in the drawing) adaptive to the third connector 51. It can be seen by comparing FIG. 10 and FIG. 4 that this PCD differs from that in FIG. 4 in the structures of the first connector 41 and the third connector 51 in order to match the corresponding power input cables. The first connector 41 in FIG. 10 includes a plurality of input terminals to match the output terminals of the power input cables, and the first connector 41 introduces multiple groups of electrical signals from the power input cables. The input terminals are classified into "input positive", "input negative" and "grounding protection". Each of the classes may include a number of input terminals so that the first connector 41 can introduce multiple groups of electrical signals from the power input cables. The structures of the second connector and the third connector 51 are not limited in the present invention as long as the combination of the two connectors enables the PCD 40 and the PSS 50 to be electrically connected and disconnected.

According to the same principles adopted by the power supply system in the first embodiment, all electrical signals transmitted over the power input cables (including positive electrical signals, negative electrical signals and ground wire electrical signals) are introduced into the PCD 40 via the first connector 41 and further transmitted to the second connector of the PCD 40 via a first transmission unit within the PCD 40, and then electrically connected to the third connector 51 of the PSS 50 via the second connector of the PCD 40. That is, the electrical signals introduced by the PCD 40 from the power input cables are exported to the PSS 50. The front view of the PSS in FIG. 7 shows the physical structure of the PSS 50. Normally, the PSS 50 includes a plurality of parallel connected power modules, which can supply power for equipment. Similarly, the PSS 50 also includes a second transmission unit which transmits the electrical signals from the third connector 51 to corresponding power module(s).

Figure 11:
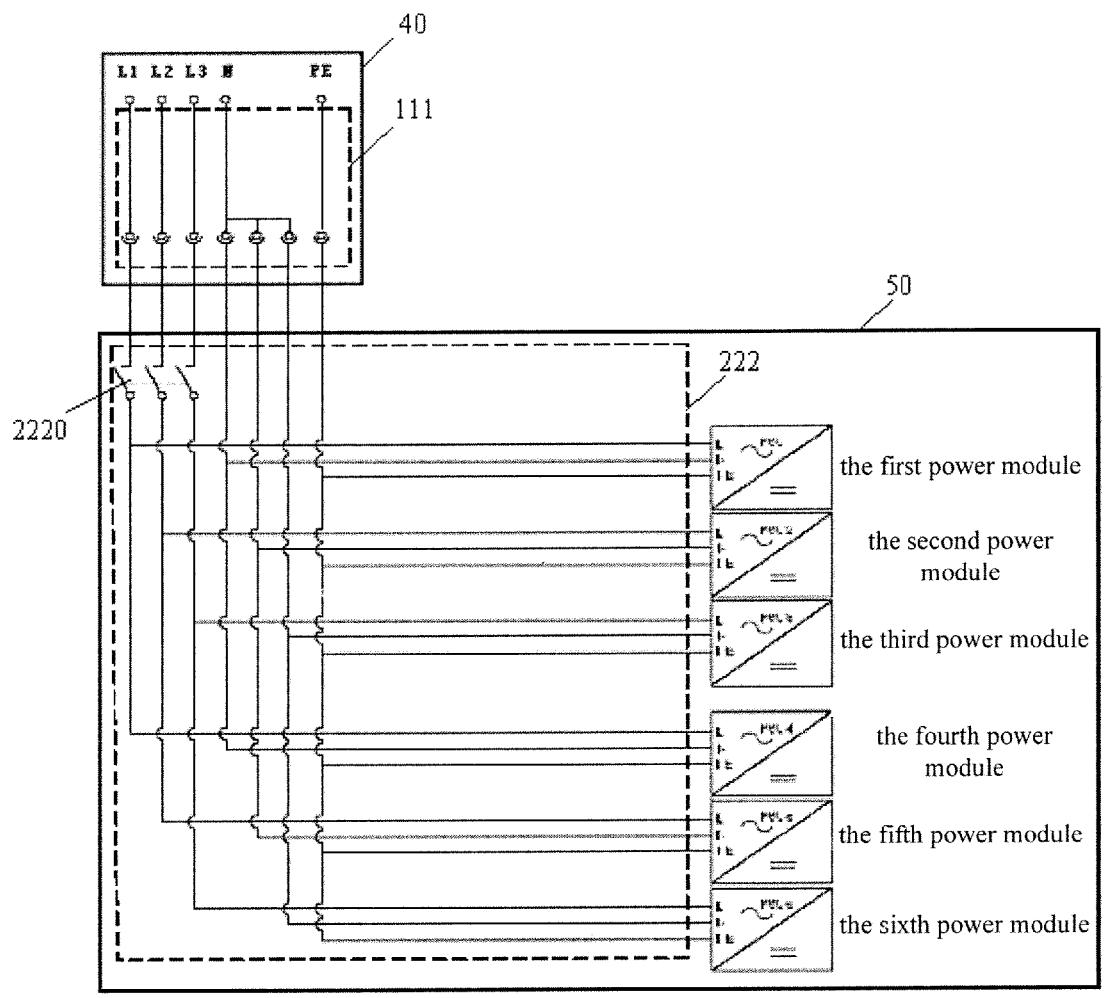
FIG. 11 is a schematic of the electrical connection of the power supply system in the first embodiment of the present invention.

FIG. 11 is a schematic illustrating the first embodiment of the electrical structure of the power supply system of the present invention. The PCD 40 in this embodiment is an AC Y-type PCD shown in FIG. 8 and this type of PCD is usually suitable for areas providing 220V AC as public power supply. The first connector 41 of the PCD 40 may include 5 terminals, namely L1, L2, L3, N and PE, or may include 7 terminals, namely L1, L2, L3, N1, N2, N3 and PE. The terminals L1, L2 and L3 are adapted to introduce live wire electrical signals from the power input cables, the terminal N (or N1, N2 and N3) is adapted to introduce zero wire electrical signals from the power input cables and the terminal PE is adapted to introduce ground wire electrical signals from the power input cables. Those skilled in the art can understand that three groups of electrical signals are introduced from the power input cables, one group is transmitted via L1, N1 or N, and PE, another group is via L2, N2 or N, and PE, and yet another group is via L3, N3 or N, and PE.

It can be seen in FIG. 11 that, after the PCD 40 introduces the electrical signals via the input terminals, the first transmission unit 111 transmits the electrical signals to the second connector (not shown in the drawing) in the PCD 40. Since the second connector of the PCD 40 is electrically connected to the third connector 51 (not shown in the drawing) of the PSS 50, the third connector 51 feeds the electrical signals imported from the second connector to the second transmission unit 222 which in turn feeds the electrical signals according to their groups to corresponding power modules. It should be noted that the first transmission unit 111 is between the input terminals (the first connector 41) and the second connector, and may be a plurality of normal wires or may be a Busbar applicable for high current. The second transmission unit 222 usually includes normal wires, and preferably is printed on the backboard of the PSS. In particular, the first transmission unit 111 transmits the electrical signals introduced via the input terminals L1, L2, L3 and PE to the second transmission unit 222 through the second connector of the PCD 40 and the third connector 51 of the PSS 50. The first transmission unit 111 shown in FIG. 11 splits the electrical signal introduced via the input terminal N into three parallel electrical signals and transmits the electrical signals to the second transmission unit 222. Furthermore, the second transmission unit 222 provides one group of electrical signals introduced via L1, N and PE for the first power module and the fourth power module respectively, provides another group of electrical signals introduced via L2, N and PE for the second power module and the fifth power module respectively and provides yet another group of electrical signals introduced via L3, N and PE for the third power module and the sixth power module respectively. Thereafter, the power modules may supply power for the equipment.

Preferably, as shown in FIG. 11, the second transmission unit 222 provides the introduced electrical signals for two power modules at the same time. Theoretically, an electrical signal introduced from a power input cable may be fed to more than one power module. However, in practical applications, the maximum current allowable on a power input cable and the maximum current able to be provided by every power module should also be taken into consideration. Hence, the PCD 40 usually introduces multiple groups of electrical signals via the first connector 41 and feeds each group of electrical signals to a number of power modules at the same time. Obviously, the PCD 40 may also introduce only one group of electrical signals and feed the group of electrical signals to all power modules of the PSS 50. It can be seen that, compared with the conventional art in which every power module needs to directly connect to power input cables, the present invention requires much less power input cables since every group of electrical signals introduced from the power input cables via the PCD can be fed to a plurality of power modules in the PSS. It is of special significance to high power equipment since the technical scheme of the present invention keeps cables in order on the surface of the equipment and the equipment will not need any excessive space.

It can also be seen from FIG. 11 that the second transmission unit 222 may further include three switches 2220, each of which controls a group of introduced electrical signals and the switches 2220 are usually mounted physically on the panel of the PSS 50. The three switches can be placed together in a row so that an operator may turn off all of the switches at the same time when the equipment needs to be powered off. That is, the three group of electrical signals introduced into the PSS 50 through the PCD 40 will be turned off and the power fed to the six power modules in the figure will be cut off. In the conventional art, the PSS provides one switch for one power module (the switch controls only the power module for which the switch is set). Therefore, it is unrealistic for the operator to turn off all the switches of the 6 power modules at the same time when the equipment shall be powered off, so some power modules will be powered off later than others and meanwhile these power modules are unable to handle the whole work load (power the whole equipment) before being powered off. As a result, the system may easily overload or function improperly. To conclude, the power supply system provided in the embodiments of the present invention reduces the risk of overload to some extent. Those skilled in the art should understand that similar switches can be set in the first transmission unit of the PCD 40 to turn on or off each group of electrical signals introduced into the PCD.

Figure 12:
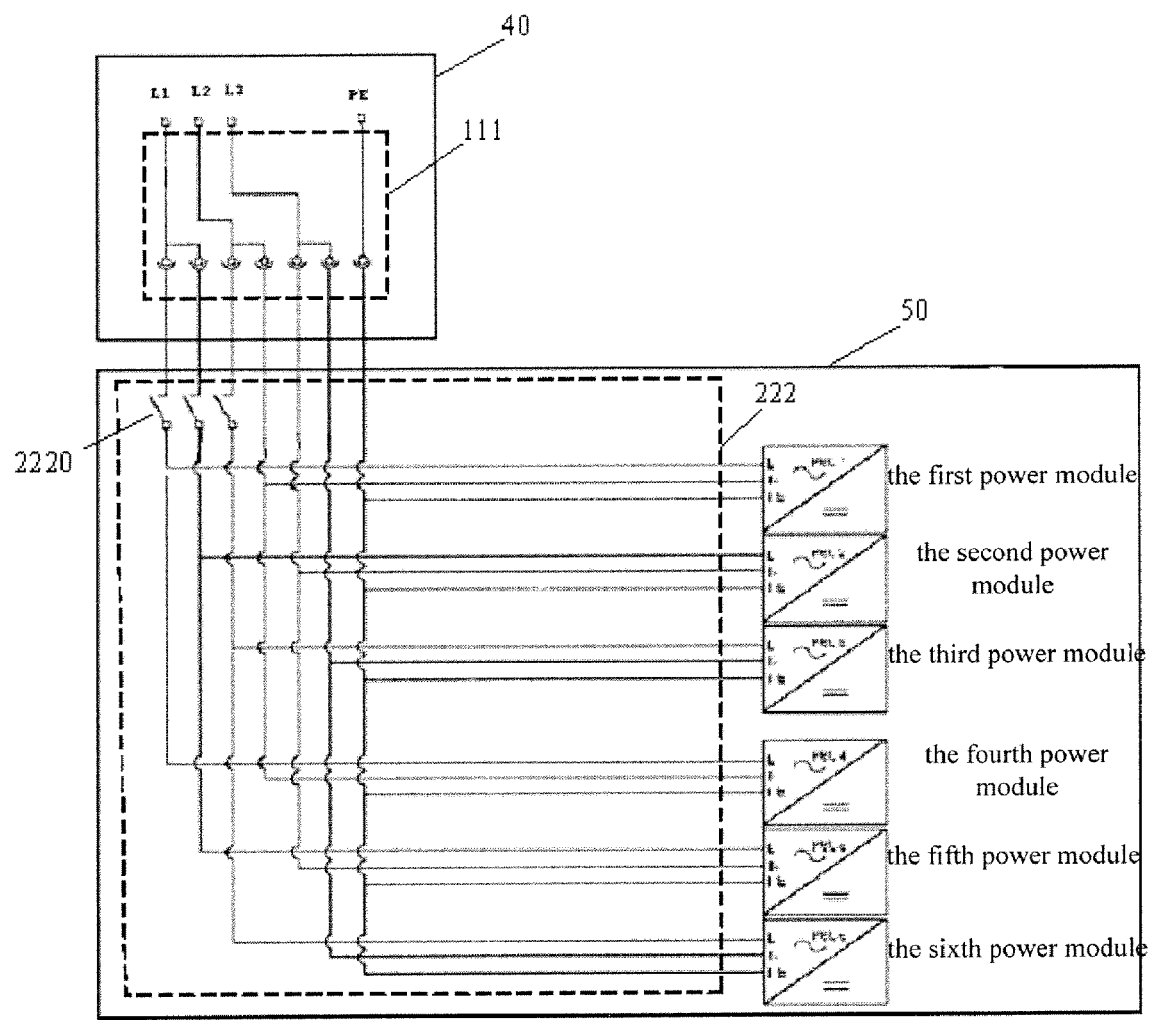
FIG. 12 is a schematic of the electrical connection of the power supply system in the second embodiment of the present invention.

FIG. 12 is a schematic illustrating the second embodiment of the electrical structure of the power supply system of the present invention. The PCD 40 in this embodiment is an AC Delta-type PCD shown in FIG. 9 and this type of PCD is usually suitable for areas providing 100 Vac as public power supply. The first connector 41 of the PCD 40 includes 4 terminals: L1, L2, L3 and PE. The terminals L1, L2 and L3 are used for live wire electrical signals introduced from the power input cables and the terminal PE is used for ground wire electrical signals introduced from the power input cables. Those skilled in the art should understand that 3 groups of electrical signals are introduced from the power input cables, one group is transmitted via the terminals L1, L2 and PE, another group is via the terminals L2, L3 and PE, and yet another group is via the terminals L1, L3 and PE. It can be seen from the comparison between FIGS. 11 and 12 that basic principles for the first transmission unit 111 and the second transmission unit 222 are identical. That is, both of the two transmission units are responsible for transmitting each group of electrical signals introduced from the power input cables to corresponding power modules. The difference between the two transmission units lies in the transmission modes decided by different types of electrical signals to be transmitted. To be specific, the first transmission unit 111 splits each of the electrical signals introduced via L1, L2 and L3 into two electrical signals and transmits these electrical signals to the second transmission unit 222. The second transmission unit 222 in turn transmits the group of electrical signals from terminals L1, L2 and PE to the first power module and the fourth power module, transmits the group of electrical signals from terminals L1, L3 and PE to the second power module and the fifth power module, and transmits the group of electrical signals from terminals L2, L3 and PE to the third power module and the sixth power module.

Figure 13:
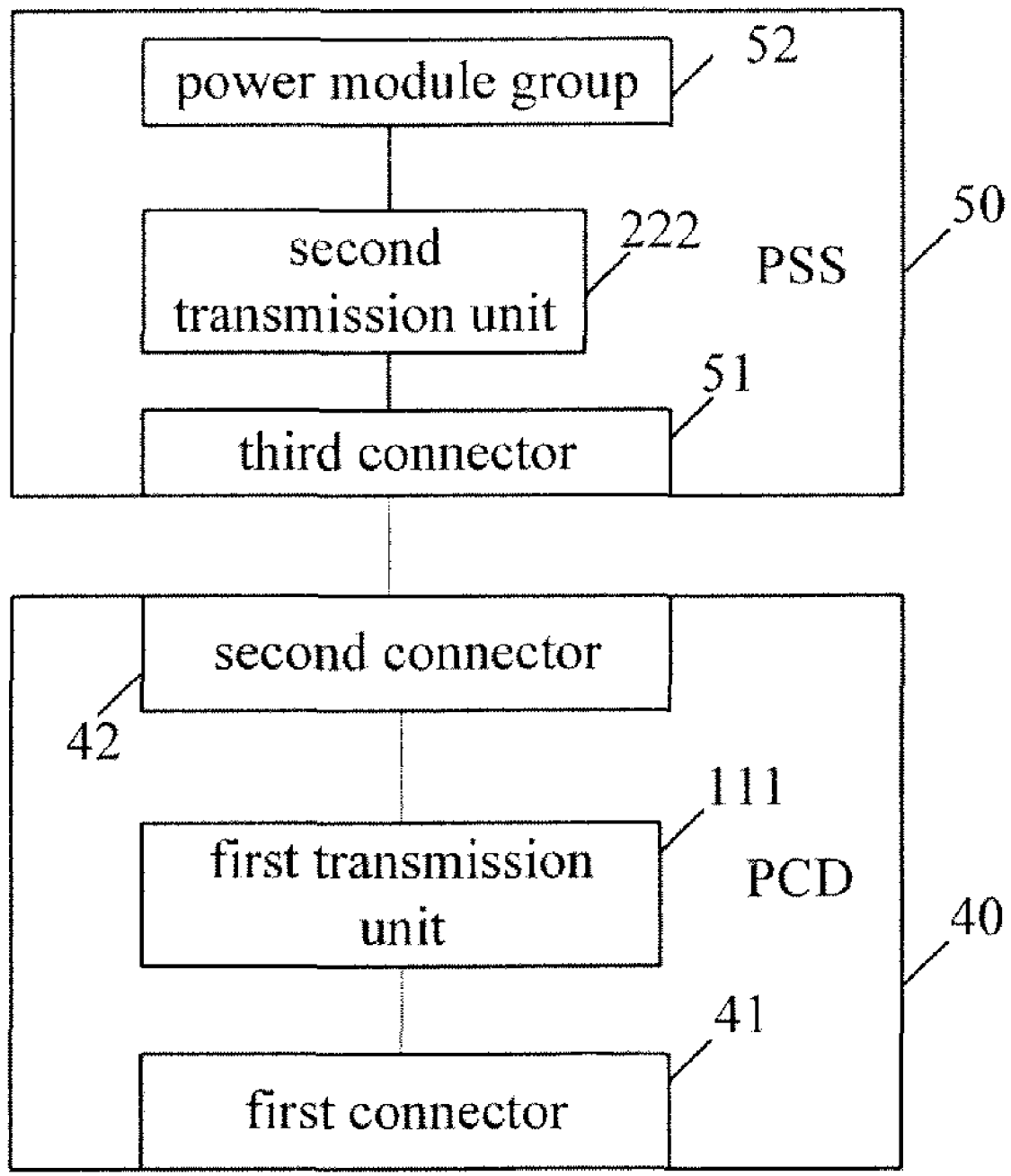
FIG. 13 is a structure schematic of a preferred embodiment of the power supply system provided by the present invention.

The preferred embodiments concerning the physical structure and the electrical structure of the power supply system provided by the present invention are explained above, and the following description will describe the logic structure of a preferred embodiment of the power supply system provided by the present invention, as shown in FIG. 13.

The power supply system of this embodiment includes a PCD 40 and a PSS 50, wherein the PCD 40 further includes a first connector 41, a second connector 42 and a first transmission unit 111, and the PSS 50 further includes a third connector 51, a second transmission unit 222 and a power module group 52. The components of the system are explained hereinafter with reference to the working principle of the system.

The PCD 40 is connected to the power input cables via the first connector 41 and introduces at least one group of electrical signals from the power input cables. The first connector 41 may adopt different types of structures, such as socket-type structure, Y-type structure and Delta-type structure, as described in the foregoing description. The first transmission unit 111 is adapted to transmit the electrical signals from the first connector 41 to the second connector 42. The first transmission unit 111 may adopt different types of structures, such as wires and Busbar. Moreover, the first transmission unit 111 may have different transmission modes, including transmitting an introduced electrical signal directly to the second connector 42 or splitting an introduced electrical signal into multiple electrical signals before transmitting the multiple electrical signals to the second connector 42. Preferably, the first transmission unit 111 may include a voltage transform module adapted to transform voltages of the electrical signals introduced through the first connector 41 to voltages needed by the PSS 50 before the electrical signals are transmitted to the second connector 42. For example, the voltage of the power input can be simply transformed in the low-cost PCD, e.g., from 110 Vac to 190 Vac, before the power is fed to the PSS, hence the power output to the integrated equipment by the power modules in the PSS will basically meet the requirements of the integrated equipment without replacing the original PSS.

The second connector 42 of the PCD 40 and the third connector of the PSS 50 are adaptive, i.e., they can be electrically connected, hence the third connector 51 transmits the electrical signals from the second connector 42 to the second transmission unit 222, and the second transmission unit 222 in turn provides the introduced electrical signals for corresponding power modules. As explained above, different structures and transmission modes may be adopted by the transmission unit 222 according to the actual needs of applications and no detailed description of the structures and transmission modes will be given herein. Preferably, the second transmission unit 222 may include one or more multiplex transmission modules to feed one or more groups of electrical signals to multiple power modules. Such preferred application of the technical scheme can reduce the total amount of the power input cables. Preferably, the second transmission unit 222 further includes switches 2220 to turn on or off the groups of electrical signals introduced from the PCD 40. Such preferred application of the technical scheme can prevent system overload to some extent.

The power supply system disclosed herein can be embedded into an equipment to form an integrated equipment together with the main machine. The electrical signals from all power input cables are introduced through the PCD to the PSS, and the main machine is powered by the power modules of the PSS. The internal structure of the PCD is simple and thus requires low cost. The PCDs of various dimensions can easily be manufactured to match the PSSs of fixed dimensions in practical applications. Furthermore, when the depth of a PSS differs greatly from that of an integrated equipment, the expensive PSS need not be replaced. A PCD of appropriate depth (dimensions) can be connected to the PSS to make the total depth of the PSS plus the PCD match the depth of the integrated equipment. In this way, the power input cables will not be difficult to be connected. Therefore, the technical scheme of the present invention broadens the application scope of the expensive PSS and enables the PSS to be adapted to integrated equipments of different depths. Obviously the power supply system of the present invention can also be installed outside of an equipment and is not limited to be embedded within the integrated equipment.

The foregoing is the description of a power supply system, a power cable distributor and an integrated equipment to which the power supply system and power cable distributor are applied. The principle and application of the present invention are explained herein with reference to embodiments of the present invention. The description of the above embodiments is only used for illustrating the method and idea of the present invention. Those skilled in the art may make modifications to the embodiments and the application scope of the present invention without departing from the spirit thereof, hence the disclosure herein should not be used for limiting the protection scope of the present invention.

The invention claimed is:

1. A power supply system comprising:
  a power cable distributor (PCD), comprising a first connector, a second connector and a first transmission unit; and
  a power supply subrack (PSS) comprising one or more power modules, a third connector and a second transmission unit, wherein
    the first connector is adapted to introduce one or more electrical signals from power input cables,
    the first transmission unit is adapted to transmit the one or more electrical signals introduced by the first connector to the second connector,
    the second connector is adapted to transmit the one or more electrical signals from the first transmission unit to a power supply subrack (PSS),
    the third connector coupled to the second connector of the PCD and adapted to introduce the electrical signals from the PCD to the second transmission unit, and
    the second transmission unit is adapted to transmit the introduced electrical signals to corresponding power modules.

2. The power supply system according to claim 1, wherein the first transmission unit further comprises a voltage transform module adapted to transform voltages of the one or more electrical signals introduced by the first connector before transmitting the electrical signals to the second connector.

3. The power supply system according to claim 1, wherein the first transmission unit further comprises a split module adapted to split an electrical signal introduced by the first connector into at least two parallel electrical signals before transmitting the electrical signals to the second connector.

4. The power supply system according to claim 1, wherein the one or more electrical signals introduced from the power input cables by the first connector of the PCD comprise at least one group of electrical signal, and
  the first transmission unit further comprises one or more switches, each of the switches being adapted to turn on or off a group of electrical signals introduced by the first connector.

5. The power supply system according to claim 1, wherein the second transmission unit comprises one or more multiplex transmission modules, each of the multiplex transmission modules being adapted to transmit a group of electrical signals introduced by the PCD to at least two power modules at the same time.

6. The power supply system according to claim 5, wherein the second transmission unit further comprises one or more switches, each of the switches being adapted to turn on or off a group of electrical signals introduced by the PCD.

7. The power supply system according to claim 1, wherein the second transmission unit further comprises one or more switches, each of the switches being adapted to turn on or off a group of electrical signals introduced by the PCD.

8. The PCD according to claim 1, wherein the PSS is embedded in an integrated equipment, and the total depth of the PSS plus the PCD match the depth of the integrated equipment when the PCD is connected to the PSS.

9. A power supply system comprising a power supply subrack (PSS) and a power cable distributor (PCD), wherein the PSS further comprises one or more power modules and a third connector,
  the PCD is adapted to introduce one or more electrical signals from power input cables, and
  the third connector in the PSS is connected to the PCD and adapted to feed the introduced electrical signals to the one or more power modules.

10. The power supply system according to claim 9, wherein the PCD further comprises a first connector, a second connector and a first transmission unit,
  the first connector is adapted to introduce the one or more electrical signals from the power input cables,
  the first transmission unit is adapted to transmit the one or more electrical signals introduced by the first connector to the second connector, and the second connector is adapted to connect the third connector in the PSS to transmit the one or more electrical signals from the first transmission unit to the third connector.

11. The power supply system according to claim 10, wherein the PSS further comprises a second transmission unit adapted to transmit the one or more electrical signals from the third connector to corresponding power modules.

12. The power supply system according to claim 11, wherein the one or more electrical signals introduced from the power input cables by the first connector of the PCD comprise at least one group of electrical signals; and
the second transmission unit comprises one or more multiplex transmission modules, each of the multiplex transmission modules being adapted to transmit a group of electrical signals introduced by the PCD to at least two power modules, respectively.

13. The power supply system according to claim 12, wherein the one or more electrical signals introduced from the power input cables by the first connector of the PCD comprise at least one group of electrical signals; and
the second transmission unit further comprises one or more switches, each of the switches being adapted to turn on or off a group of electrical signals introduced by the PCD.

14. The power supply system according to claim 12, wherein the first transmission unit of the PCD further comprises a voltage transform module adapted to transform voltages of the one or more electrical signals introduced by the first connector before transmitting the electrical signals to the second connector.

15. The power supply system according to claim 12, wherein the first transmission unit of the PCD further comprises a split module adapted to split an electrical signal introduced by the first connector into at least two parallel electrical signals before transmitting the electrical signals to the second connector.

16. The power supply system according to claim 10, wherein the one or more electrical signals introduced from the power input cables by the first connector of the PCD comprise at least one group of electrical signals; and
the first transmission unit further comprises one or more switches, each of the switches being adapted to turn on or off a group of electrical signals introduced by the first connector.

17. The power supply system according to claim 10, wherein the first transmission unit of the PCD further comprises a voltage transform module adapted to transform voltages of the one or more electrical signals introduced by the first connector before transmitting the electrical signals to the second connector.

18. The power supply system according to claim 10, wherein the first transmission unit of the PCD further comprises a split module adapted to split an electrical signal introduced by the first connector into at least two parallel electrical signals before transmitting the electrical signals to the second connector.

19. The power supply system according to claim 11, wherein the one or more electrical signals introduced from the power input cables by the first connector of the PCD comprise at least one group of electrical signals; and
the second transmission unit further comprises one or more switches, each of the switches being adapted to turn on or off a group of electrical signals introduced by the PCD.

20. The power supply system according to claim 11, wherein the first transmission unit of the PCD further comprises a voltage transform module adapted to transform voltages of the one or more electrical signals introduced by the first connector before transmitting the electrical signals to the second connector.

21. The power supply system according to claim 11, wherein the first transmission unit of the PCD further comprises a split module adapted to split an electrical signal introduced by the first connector into at least two parallel electrical signals before transmitting the electrical signals to the second connector.

* * * * *

UNITED STATES PATENT AND TRADEMARK OFFICE
CERTIFICATE OF CORRECTION

PATENT NO.       : 7,907,416 B2
APPLICATION NO.  : 12/323103
DATED            : March 15, 2011
INVENTOR(S)      : Ying He et al.

It is certified that error appears in the above-identified patent and that said Letters Patent is hereby corrected as shown below:

In column 10, line 27, in Claim 4, delete "signal," and insert --signals,--, therefor.

Signed and Sealed this
First Day of May, 2012

David J. Kappos
*Director of the United States Patent and Trademark Office*